United States Patent
Park et al.

(10) Patent No.: US 10,469,102 B2
(45) Date of Patent: Nov. 5, 2019

(54) ELECTRONIC DEVICE FOR COMPRESSING DATA AND METHOD FOR OPERATING THE SAME

(71) Applicant: Samsung Electronics Co., Ltd., Suwon-si, Gyeonggi-do (KR)

(72) Inventors: Chan-Sik Park, Hwaseong-si (KR); Chan-Yul Park, Yongin-si (KR); Yong-Chul Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/979,904

(22) Filed: May 15, 2018

(65) Prior Publication Data
US 2018/0337690 A1    Nov. 22, 2018

(30) Foreign Application Priority Data
May 19, 2017   (KR) .......................... 10-2017-0062441

(51) Int. Cl.
  *H03M 7/40*    (2006.01)
  *H03M 7/42*    (2006.01)
  *H03M 7/30*    (2006.01)

(52) U.S. Cl.
  CPC ........... *H03M 7/4031* (2013.01); *H03M 7/40* (2013.01); *H03M 7/42* (2013.01); *H03M 7/6035* (2013.01)

(58) Field of Classification Search
  CPC .... H03M 7/4031; H03M 7/6035; H03M 7/40; H03M 7/42
  USPC ..................................................... 341/87, 150
  See application file for complete search history.

(56) References Cited

U.S. PATENT DOCUMENTS

| | | | |
|---|---|---|---|
| 6,324,214 B2 * | 11/2001 | Mihara | ................ H04N 19/172 375/240.02 |
| 6,339,804 B1 * | 1/2002 | Shimoda | .......... G11B 20/00007 341/51 |
| 8,160,137 B2 * | 4/2012 | Ho | ........................... G06K 9/36 375/240.02 |
| 2008/0252499 A1 | 10/2008 | Perrone et al. | |

* cited by examiner

*Primary Examiner* — Brian K Young

(57) ABSTRACT

According to an embodiment of the present disclosure, an electronic device may comprise a memory and a processor configured to produce compressed data by compressing data including a first block and a second block stored in the memory, wherein the processor may be configured to include a first replacement data table corresponding to first sub-data in the compressed data, the first sub-data included in the first block, and the first replacement data table produced based on, at least, rankings of first frequencies for the first sub-data, and include information for reference to the first replacement data table, corresponding to the second block, when second sub-data included in the second block and rankings of second frequencies for the second sub-data meet a designated condition with respect to the first sub-data included in the first block and the rankings of the first frequencies. Other embodiments are also possible.

20 Claims, 8 Drawing Sheets

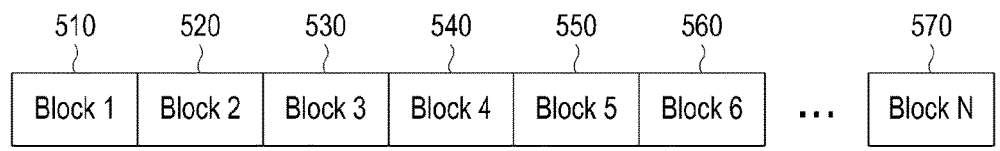
FIG.5
| | Symbol | Frequency | Probability |
|---|---|---|---|
| | | 9 | 0.321429 |
| | * | 7 | 0.25 |
| | A | 5 | 0.178571 |
| | 1 | 3 | 0.107143 |
| | @ | 3 | 0.107143 |
| | B | 1 | 0.035714 |
| 총합 | 6 | 28 | 1 |
FIG.6A
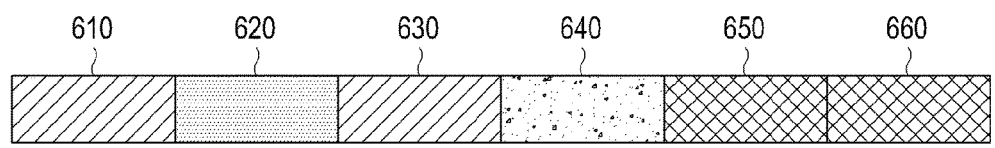
FIG.6B

| Symbol | Code(binary data) |
|--------|-------------------|
|        | 0                 |
| *      | 10                |
| A      | 110               |
| 1      | 1110              |
| @      | 11110             |
| B      | 111110            |
FIG.7
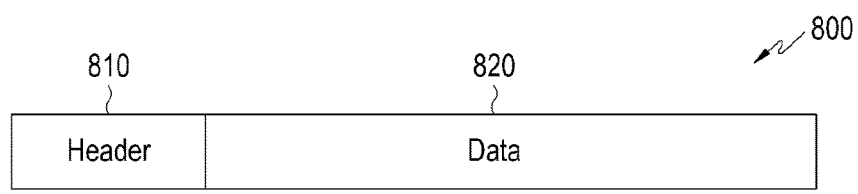
FIG.8
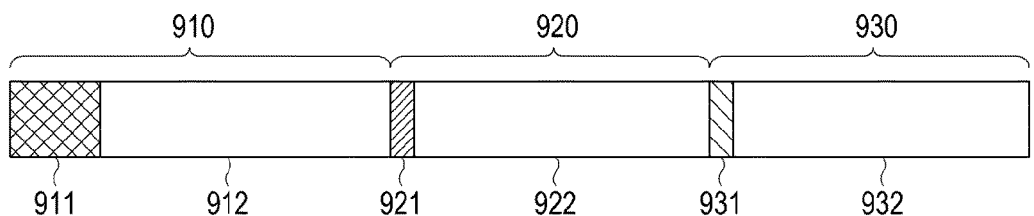
FIG.9

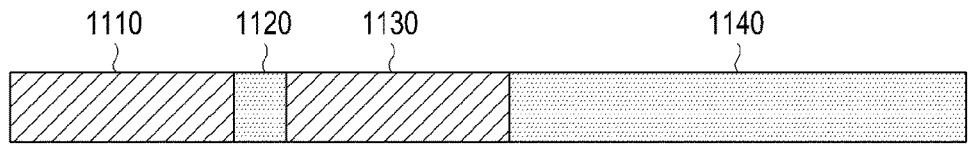
FIG.11
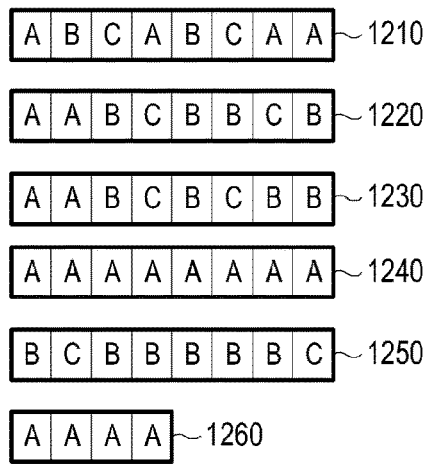
FIG.12A
FIG.12B
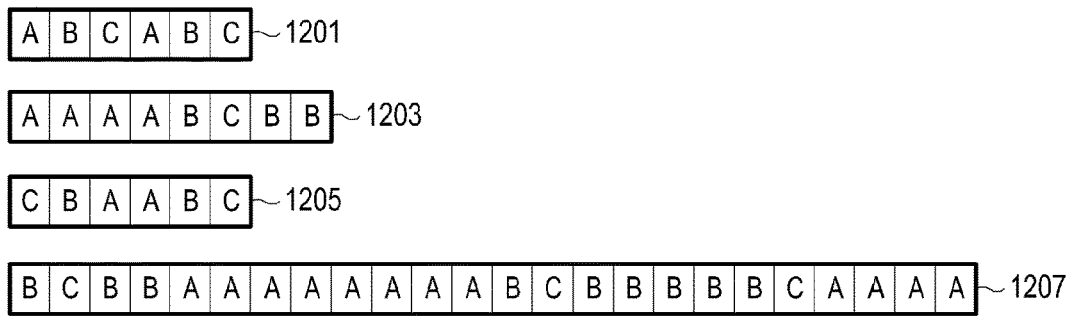
FIG.12C

US 10,469,102 B2

ELECTRONIC DEVICE FOR COMPRESSING DATA AND METHOD FOR OPERATING THE SAME

CROSS-REFERENCE TO RELATED APPLICATIONS AND CLAIM OF PRIORITY

This application claims the benefit under 35 U.S.C. § 119(a) of a Korean patent application filed in the Korean Intellectual Property Office on May 19, 2017 and assigned Serial No. 10-2017-0062441, the disclosure of which is incorporated herein by reference in its entirety.

BACKGROUND

1. Field

Various embodiments of the present disclosure concern electronic devices for compressing data and methods for operating the same.

2. Description of Related Art

Among data compression techniques, entropy coding is a method for converting data into bit streams compressed to be adequate for transmission and storage based on probability. Entropy coding encompasses Huffman coding, arithmetic coding, and context-based adaptive encoding.

Probability-based variable length entropy coding performs data compression by assigning bits not in the same length but rather in variable lengths depending on the probability of occurrence of corresponding symbols in the whole data.

For example, data compressed by probability-based entropy coding may include coded data and a codebook (or probability table) for decoding the coded data. As per probability-based entropy coding, the encoder put, in the compressed file, codebooks each corresponding to a respective one of different coding windows, although the blocks have the same or similar probability distributions. This results in the duplicate transmission of codebooks with the same or similar information, causing the data bulky.

The above information is presented as background information only to assist with an understanding of the present disclosure. No determination has been made, and no assertion is made, as to whether any of the above might be applicable as prior art with regard to the present disclosure.

SUMMARY

According to various embodiments, an electronic device may prevent duplicate inclusion of the same or similar probability tables or codebooks in data compressed as per probability-based entropy coding on blocks with the same or similar probability distributions in data.

In order to avoid duplicate inclusion of probability tables or codebooks in compressed data, an electronic device, according to an embodiment of the present disclosure, upon being able to reuse the same or similar probability tables or codebooks, may include only information for reference to a prior probability table or codebook and information about some changes, but rather than all the probability tables or codebooks, in the compressed data.

According to an embodiment of the present disclosure, an electronic device may comprise a memory and a processor configured to produce compressed data by compressing data including a first block and a second block stored in the memory, wherein the processor may be configured to include a first replacement data table corresponding to first sub-data in the compressed data, the first sub-data included in the first block, and the first replacement data table produced based on, at least, rankings of first frequencies for the first sub-data, and include information for reference to the first replacement data table, corresponding to the second block, when second sub-data included in the second block and rankings of second frequencies for the second sub-data meet a designated condition with respect to the first sub-data included in the first block and the rankings of the first frequencies.

According to an embodiment of the present disclosure, an electronic device may comprise a communication circuit and a processor configured to, upon receiving a request for transmitting target data, transmit first data of a first size, the first data including first encoding data obtained by encoding the target data and first additional data for decoding the first encoding data and upon receiving a request for re-transmitting the target data after the first data is transmitted, transmit second data of a second size, the second data including the first encoding data and second additional data for decoding the first encoding data. The second size may be smaller than the first size.

According to an embodiment of the present disclosure, there may be provided a computer-readable recording medium storing instructions configured to perform at least one operation by a processor, the at least one operation comprising producing, by the processor, compressed data by compressing data stored in a memory functionally connected with an electronic device, including, by the processor, a first replacement data table corresponding to first sub-data in the compressed data, the first sub-data included in a first block of the data, and the first replacement data table produced based on, at least, rankings of first frequencies for the first sub-data, and including, by the processor, information for reference to the first replacement data table, corresponding to the second block, when second sub-data included in a second block of the data and rankings of second frequencies for the second sub-data meet a designated condition with respect to the first sub-data included in the first block and the rankings of the first frequencies.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

A more complete appreciation of the present disclosure and many of the attendant aspects thereof will be readily obtained as the same becomes better understood by reference to the following detailed description when considered in connection with the accompanying drawings, wherein:

FIG. 5 is a concept view illustrating input data including multiple blocks according to an embodiment of the present disclosure;

FIG. 6A is a view illustrating an example of a probability table for input data according to an embodiment of the present disclosure;

FIG. 6B is a view illustrating an example of a probability distribution per block for input data according to an embodiment of the present disclosure;

FIG. 7 is a view illustrating a replacement data table for input data according to an embodiment of the present disclosure;

FIG. 8 is a concept view illustrating compressed data according to an embodiment of the present disclosure;

FIG. 9 is a view illustrating an example of compressed data including a plurality of blocks according to an embodiment of the present disclosure;

FIG. 11 is a view illustrating an example of compressed data according to an embodiment of the present disclosure;

FIG. 12A is a view illustrating an example of input data according to an embodiment of the present disclosure;

FIG. 12B is a concept view illustrating input data as per a fixed block probability table according to an embodiment of the present disclosure; and FIG. 12C is a concept view illustrating input data as per a variable block probability table according to an embodiment of the present disclosure.

Throughout the drawings, like reference numerals will be understood to refer to like parts, components, and structures.

DETAILED DESCRIPTION

Figure 1:
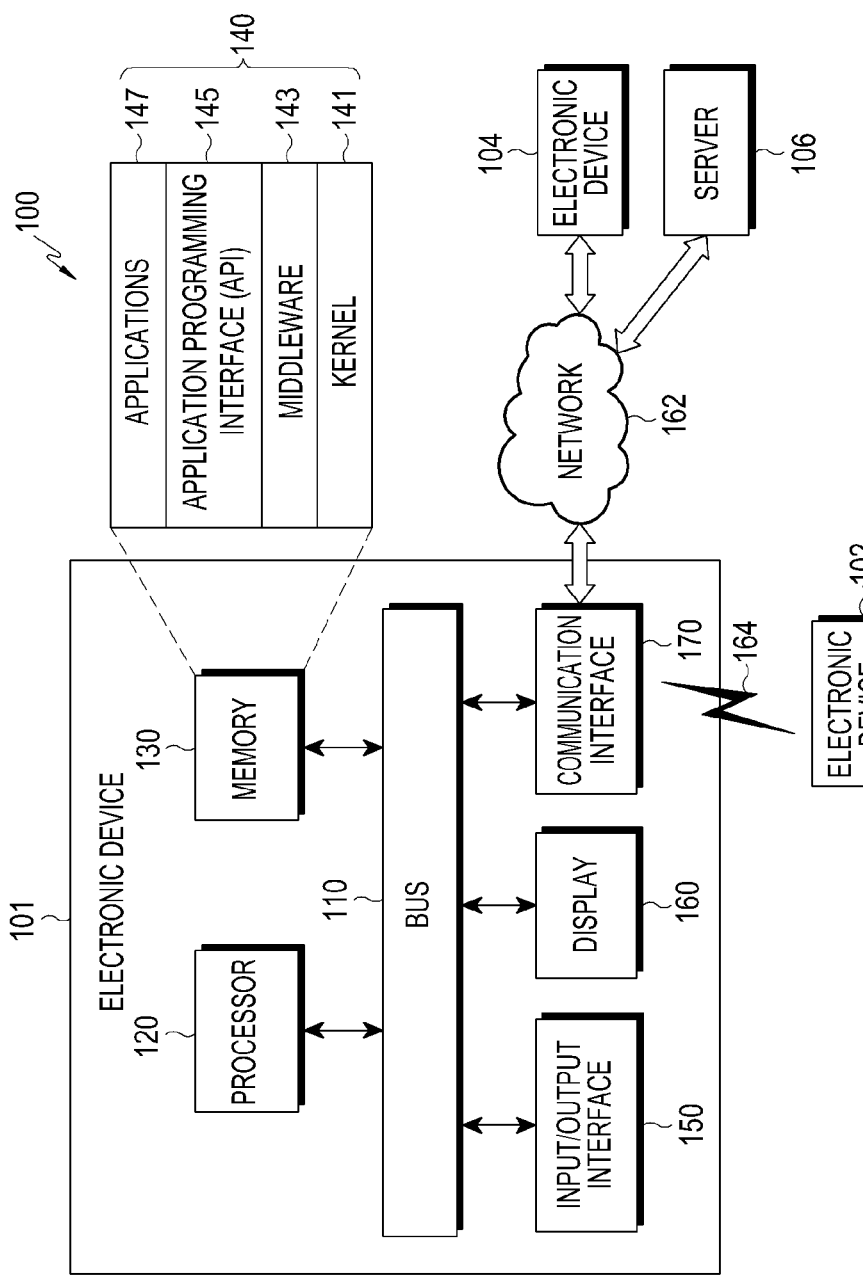
FIG. 1 is a block diagram illustrating an electronic device and a network according to an embodiment of the present disclosure.

FIGS. 1 through 12C, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, embodiments of the present disclosure are described with reference to the accompanying drawings. However, it should be appreciated that the present disclosure is not limited to the embodiments and the terminology used herein, and all changes and/or equivalents or replacements thereto also belong to the scope of the present disclosure. The same or similar reference denotations may be used to refer to the same or similar elements throughout the specification and the drawings. It is to be understood that the singular forms "a," "an," and "the" include plural references unless the context clearly dictates otherwise. As used herein, the terms "A or B" or "at least one of A and/or B" may include all possible combinations of A and B. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the terms "configured to" may be interchangeably used with other terms, such as "suitable for," "capable of," "modified to," "made to," "adapted to," "able to," or "designed to" in hardware or software in the context. Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a MP3 player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In some embodiments, examples of the smart home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV', or Google TV™), a gaming console (Xbox™ PlayStation™), an electronic dictionary, an electronic key, a camcorder, or an electronic picture frame.

According to an embodiment of the present disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, drones, automatic teller's machines (ATMs), point of sales (POS) devices, or internet of things (IoT) devices (e.g., a bulb, various sensors, a sprinkler, a fire alarm, a thermostat, a street light, a toaster, fitness equipment, a hot water tank, a heater, or a boiler). According to various embodiments of the disclosure, examples of the electronic device may at least one of part of a piece of furniture, building/structure or vehicle, an electronic board, an electronic signature receiving device, a projector, or various measurement devices (e.g., devices for measuring water, electricity, gas, or electromagnetic waves). According to embodiments of the present disclosure, the electronic device may be flexible or may be a combination of the above-enumerated electronic devices. According to an embodiment of the present disclosure, the electronic device is not limited to the above-listed embodiments. As used herein, the term "user" may denote a human or another device (e.g., an artificial intelligent electronic device) using the electronic device.

Referring to FIG. 1, according to an embodiment of the present disclosure, an electronic device 100 is included in a network environment. The electronic device 101 may include a bus 110, a processor 120, a memory 130, an input/output interface 150, a display 160, and a communication interface 170. In some embodiments, the electronic device 101 may exclude at least one of the components or may add another component. The bus 110 may include a circuit for connecting the components 110 to 170 with one another and transferring communications (e.g., control messages or data) between the components. The processor 120 may include one or more of a central processing unit (CPU), an application processor (AP), or a communication processor (CP). The processor 120 may perform control on at least one of the other components of the electronic device 101 or perform an operation or data processing relating to communication.

The memory 130 may include a volatile and/or non-volatile memory. For example, the memory 130 may store commands or data related to at least one other component of, e.g., the electronic device 101. According to an embodiment of the present disclosure, the memory 130 may store software and/or a program 140. The program 140 may include, e.g., a kernel 141, middleware 143, an application programming interface (API) 145, and/or an application program (or "application") 147. At least a portion of the kernel 141, middleware 143, or API 145 may be denoted an operating system (OS). For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. Further, the middleware 143 may process one or more task requests received from the application program 147 in order of priority. For example, the middleware 143 may assign a priority of using system resources (e.g., bus 110, processor 120, or memory 130) of the electronic device 101 to at least one of the application programs 147 and process one or more task requests. The API 145 is an interface allowing the application 147 to control functions provided from the kernel 141 or the middleware 143. For example, the API 145 may include at least one interface or function (e.g., a command) for filing control, window control, image processing or text control. For example, the input/output interface 150 may transfer commands or data input from the user or other external device to other component(s) of the electronic device 101 or may output commands or data received from other component(s) of the electronic device 101 to the user or other external devices.

The display 160 may include, e.g., a liquid crystal display (LCD), a light emitting diode (LED) display, an organic light emitting diode (OLED) display, or a microelectromechanical systems (MEMS) display, or an electronic paper display. The display 160 may display, e.g., various contents (e.g., text, images, videos, icons, and/or symbols) to the user. The display 160 may include a touchscreen and may receive, e.g., a touch, gesture, proximity or hovering input using an electronic pen or a body portion of the user. For example, the communication interface 170 may set up communication between the electronic device 101 and an external electronic device (e.g., a first electronic device 102, a second electronic device 104, or a server 106). For example, the communication interface 170 may be connected with the network 162 through wireless or wired communication to communicate with the external electronic device (e.g., the second external electronic device 104 or server 106).

The wireless communication may include cellular communication which uses at least one of, e.g., long term evolution (LTE), long term evolution—advanced (LTE-A), code division multiple access (CDMA), wideband code division multiple access (WCDMA), universal mobile telecommunication system (UMTS), wireless broadband (WiBro), or global system for mobile communication (GSM). According to an embodiment of the present disclosure, the wireless communication may include at least one of, e.g., wireless fidelity (Wi-Fi), bluetooth, bluetooth low power (BLE), zigbee, near field communication (NFC), magnetic secure transmission (MST), radio frequency, or body area network (BAN). According to an embodiment of the present disclosure, the wireless communication may include global navigation satellite system (GNSS). The GNSS may be, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, power line communication (PLC), or plain old telephone service (POTS). The network 162 may include at least one of telecommunication networks, e.g., a computer network (e.g., local area network (LAN) or wide area network (WAN)), Internet, or a telephone network.

The first and second external electronic devices 102 and 104 each may be a device of the same or a different type from the electronic device 101. According to an embodiment of the present disclosure, all or some of operations executed on the electronic device 101 may be executed on another or multiple other electronic devices (e.g., the electronic devices 102 and 104 or server 106). According to an embodiment of the present disclosure, when the electronic device 101 should perform some function or service automatically or at a request, the electronic device 101, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

According to an embodiment of the present disclosure, the electronic device 101 may include a memory 130 and a processor 120 configured to produce compressed data by compressing data including a first block and a second block stored in the memory. The processor 120 may be configured to include a first replacement data table corresponding to first sub-data (e.g., symbols) in the compressed data, the first sub-data included in the first block, and the first replacement data table produced based on, at least, rankings (or probabilities) of first frequencies for the first sub-data and include information for reference to the first replacement data table, corresponding to the second block, when second sub-data included in the second block and rankings of second frequencies for the second sub-data meet a designated condition with respect to the first sub-data included in the first block and the rankings of the first frequencies.

According to an embodiment of the present disclosure, the processor 120 may be configured to determine that the designated condition is met when the second sub-data included in the second block and the rankings of the second frequencies are the same, or similar by a designated degree or more, to the first sub-data included in the first block and the rankings of the first frequencies.

According to an embodiment of the present disclosure, the processor 120 may be configured to designate, as the first replacement data table reference information, index information indicating a position of the first replacement data table in the compressed data.

According to an embodiment of the present disclosure, the processor 120 may be configured to further include at least one piece of replacement information for the first replacement data table, corresponding to the second block.

According to an embodiment of the present disclosure, the processor 120 may be configured to set, as the replacement information, replacement information about a replacement data value designated corresponding to sub-data of the second sub-data contained in the second block, which differs in type and frequency ranking from the first sub-data contained in the first block.

According to an embodiment of the present disclosure, the processor 120 may be configured to determine a length of replacement data designated for the first sub-data in proportion to the rankings of the first frequencies for the first sub-data.

According to an embodiment of the present disclosure, the processor 120 may be configured to compress the data in a variable-length entropy coding scheme. The processor 120 may be configured to use the rankings of the frequencies for the sub-data included in each block of the data as probability information for the variable-length entropy coding scheme.

According to an embodiment of the present disclosure, the processor 120 may be configured to compress the first replacement data table using a lossless compression scheme.

According to an embodiment of the present disclosure, the processor 120 may be configured to determine a size of the second block according to a range in which the first replacement data table applies. The second block may be different in size from the first block. The processor 120 may be configured to further include information for identifying the size of the second block in the compressed data.

Figure 2:
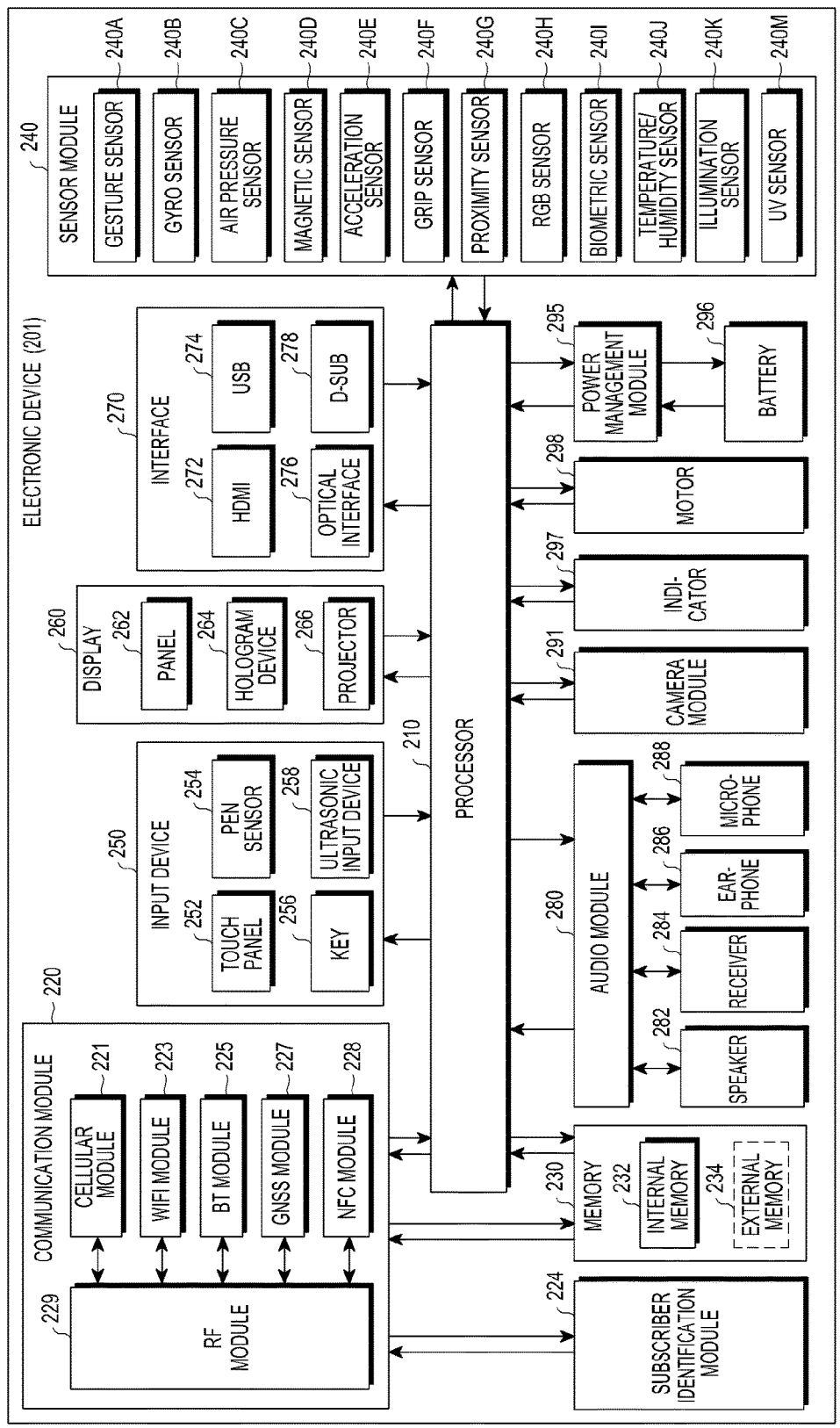
FIG. 2 is a block diagram illustrating an electronic device according to an embodiment of the present disclosure.

FIG. 2 is a block diagram illustrating an electronic device 201 according to an embodiment of the present disclosure. An electronic device 201 may include the whole or part of, e.g., the electronic device 101 of FIG. 1. The electronic device 201 may include one or more processors (e.g., application processors (APs)) 210, a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298. The processor 210 may control multiple hardware and software components connected to the processor 210 by running, e.g., an operating system or application programs, and the processor 210 may process and compute various data. The processor 210 may be implemented in, e.g., a system on chip (SoC). According to an embodiment of the present disclosure, the processor 210 may further include a graphic processing unit (GPU) and/or an image signal processor. The processor 210 may include at least some (e.g., the cellular module 221) of the components shown in FIG. 2. The processor 210 may load a command or data received from at least one of other components (e.g., a non-volatile memory) on a volatile memory, process the command or data, and store resultant data in the non-volatile memory.

The communication module 220 may have the same or similar configuration to the communication interface 170. The communication module 220 may include, e.g., a cellular module 221, a wireless fidelity (Wi-Fi) module 223, a bluetooth (BT) module 225, a GNSS module 227, a NFC module 228, and a RF module 229. The cellular module 221 may provide voice call, video call, text, or Internet services through, e.g., a communication network. According to an embodiment of the present disclosure, the cellular module 221 may perform identification or authentication on the electronic device 201 in the communication network using a subscriber identification module 224 (e.g., the SIM card).

According to an embodiment of the present disclosure, the cellular module 221 may perform at least some of the functions providable by the processor 210. According to an embodiment of the present disclosure, the cellular module 221 may include a communication processor (CP). According to an embodiment of the present disclosure, at least some (e.g., two or more) of the cellular module 221, the Wi-Fi module 223, the bluetooth module 225, the GNSS module 227, or the NFC module 228 may be included in a single integrated circuit (IC) or an IC package. The RF module 229 may transmit and receive, e.g., communication signals (e.g., radio frequency (RF) signals). The RF module 229 may include, e.g., a transceiver, a power amp module (PAM), a frequency filter, a low noise amplifier (LNA), or an antenna. According to an embodiment of the present disclosure, at least one of the cellular module 221, the Wi-Fi module 223, the bluetooth module 225, the GNSS module 227, or the NFC module 228 may communicate RF signals through a separate RF module. The subscriber identification module 224 may include, e.g., a card including a subscriber identification module, or an embedded SIM, and may contain unique identification information (e.g., an integrated circuit card identifier (ICCID) or subscriber information (e.g., an international mobile subscriber identity (IMSI)).

The memory 230 (e.g., the memory 130) may include, e.g., an internal memory 232 or an external memory 234. For example, the internal memory 232 may include at least one of a volatile memory (e.g., a dynamic RAM (DRAM), a static RAM (SRAM), a synchronous dynamic RAM (SDRAM), etc.) or a non-volatile memory (e.g., a one-time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash, or a NOR flash), a hard drive, or solid state drive (SSD). The external memory 234 may include a flash drive, e.g., a compact flash (CF) memory, a secure digital (SD) memory, a micro-SD memory, a min-SD memory, an extreme digital (xD) memory, a multi-media card (MMC), or a Memory Stick™. The external memory 234 may be functionally or physically connected with the electronic device 201 via various interfaces.

For example, the sensor module 240 may measure a physical quantity or detect a motion state of the electronic device 201, and the sensor module 240 may convert the measured or detected information into an electrical signal. The sensor module 240 may include at least one of, e.g., a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (e.g., a red-green-blue (RGB) sensor), a bio sensor 240I, a temperature/humidity sensor 240J, an illumination sensor 240K, or an Ultra Violet (UV) sensor 240M. Additionally or alternatively, the sensor module 240 may include, e.g., an e-nose sensor, an electromyography (EMG) sensor, an electroencephalogram (EEG) sensor, an electrocardiogram (ECG) sensor, an infrared (IR) sensor, an iris sensor, or a finger print sensor. The sensor module 240 may further include a control circuit for controlling at least one or more of the sensors included in the sensing module. According to an embodiment of the present disclosure, the electronic device 201 may further include a processor configured to control the sensor module 240 as part of the processor 210 or separately from the processor 210, and the electronic device 2701 may control the sensor module 240 while the processor 210 is in a sleep mode.

The input device 250 may include, e.g., a touch panel 252, a (digital) pen sensor 254, a key 256, or an ultrasonic input device 258. The touch panel 252 may use at least one of capacitive, resistive, infrared, or ultrasonic methods. The touch panel 252 may further include a control circuit. The touch panel 252 may further include a tactile layer and may provide a user with a tactile reaction. The (digital) pen sensor 254 may include, e.g., a part of a touch panel or a separate sheet for recognition. The key 256 may include e.g., a hardware button, optical key or key pad. The ultrasonic input device 258 may sense an ultrasonic wave generated from an input tool through a microphone (e.g., the microphone 288) to identify data corresponding to the sensed ultrasonic wave.

The display 260 (e.g., the display 160) may include a panel 262, a hologram device 264, a projector 266, and/or a control circuit for controlling the same. The panel 262 may be implemented to be flexible, transparent, or wearable. The panel 262, together with the touch panel 252, may be configured in one or more modules. According to an embodiment of the present disclosure, the panel 262 may include a pressure sensor (or pose sensor) that may measure the strength of a pressure by the user's touch. The pressure sensor may be implemented in a single body with the touch panel 252 or may be implemented in one or more sensors separate from the touch panel 252. The hologram device 264 may make three dimensional (3D) images (holograms) in the air by using light interference. The projector 266 may display an image by projecting light onto a screen. The screen may be, for example, located inside or outside of the electronic device 201. The interface 270 may include e.g., a high definition multimedia interface (HDMI) 272, a USB 274, an optical interface 276, or a D-subminiature (D-sub) 278. The interface 270 may be included in e.g., the communication interface 170 shown in FIG. 1. Additionally or alternatively, the interface 270 may include a mobile high-definition link (MHL) interface, a secure digital (SD) card/multimedia card (MMC) interface, or infrared data association (IrDA) standard interface.

The audio module 280 may convert, e.g., a sound signal into an electrical signal and vice versa. At least a part of the audio module 280 may be included in, e.g., the input/output interface 150 as shown in FIG. 1. The audio module 280 may process sound information input or output through e.g., a speaker 282, a receiver 284, an earphone 286, or a microphone 288. For example, the camera module 291 may be a device for capturing still images and videos, and may include, according to an embodiment of the present disclosure, one or more image sensors (e.g., front and back sensors), a lens, an image signal processor (ISP), or a flash such as an LED or xenon lamp. The power manager module 295 may manage power of the electronic device 201, for example. According to an embodiment of the present disclosure, the power manager module 295 may include a power management Integrated circuit (PMIC), a charger IC, or a battery or fuel gauge. The PMIC may have a wired and/or wireless recharging scheme. The wireless charging scheme may include e.g., a magnetic resonance scheme, a magnetic induction scheme, or an electromagnetic wave-based scheme, and an additional circuit, such as a coil loop, a resonance circuit, a rectifier, or the like may be added for wireless charging. The battery gauge may measure an amount of remaining power of the battery 296, a voltage, a current, or a temperature while the battery 296 is being charged. The battery 296 may include, e.g., a rechargeable battery and/or a solar battery.

The indicator 297 may indicate a particular state of the electronic device 201 or a part (e.g., the processor 210) of the electronic device, including e.g., a booting state, a message state, or recharging state. The motor 298 may convert an electric signal to a mechanical vibration and may generate a vibrational or haptic effect. The electronic device 201 may include a mobile TV supporting device (e.g., a GPU) that may process media data as per, e.g., digital multimedia broadcasting (DMB), digital video broadcasting (DVB), or mediaFlo™ standards. Each of the aforementioned components of the electronic device may include one or more parts, and a name of the part may vary with a type of the electronic device. According to various embodiments, the electronic device (e.g., the electronic device 201) may exclude some elements or include more elements, or some of the elements may be combined into a single entity that may perform the same function as by the elements before combined.

According to an embodiment of the present disclosure, the electronic device 201 (or the electronic device 101) may include a communication circuit (e.g., the communication module 220) and a processor 210 configured to produce compressed data by compressing data including a first block and a second block stored in the memory. The processor 210 may be configured to include a first replacement data table corresponding to first sub-data in the compressed data, the first sub-data included in the first block, and the first replacement data table produced based on, at least, rankings of first frequencies for the first sub-data and include information for reference to the first replacement data table, corresponding to the second block, when second sub-data included in the second block and rankings of second frequencies for the second sub-data meet a designated condition with respect to the first sub-data included in the first block and the rankings of the first frequencies.

According to an embodiment of the present disclosure, the processor 210 may be configured to determine that the designated condition is met when the second sub-data included in the second block and the rankings of the second frequencies are the same, or similar by a designated degree or more, to the first sub-data included in the first block and the rankings of the first frequencies.

According to an embodiment of the present disclosure, the processor 210 may be configured to designate, as the first replacement data table reference information, index information indicating a position of the first replacement data table in the compressed data.

According to an embodiment of the present disclosure, the processor 210 may be configured to further include at least one piece of replacement information for the first replacement data table, corresponding to the second block.

According to an embodiment of the present disclosure, the processor 210 may be configured to set, as the replacement information, replacement information about a replacement data value designated corresponding to sub-data of the second sub-data contained in the second block, which differs in type and frequency ranking from the first sub-data contained in the first block.

According to an embodiment of the present disclosure, the processor 210 may be configured to determine a length of replacement data designated for the first sub-data in proportion to the rankings of the first frequencies for the first sub-data. For example, where the frequency ranking for symbol A is 2, and the frequency ranking for symbol B is 3, the length of the replacement data (e.g., 10) designated for symbol A may be 2, and the length of the replacement data (e.g., 110) designated for symbol B may be 3. Here, 'proportion' means the relation between the absolute ranking and the replacement data length.

According to an embodiment of the present disclosure, the processor 210 may be configured to compress the data in a variable-length entropy coding scheme. The processor 120 may be configured to use the rankings of the frequencies for the sub-data included in each block of the data as probability information for the variable-length entropy coding scheme.

According to an embodiment of the present disclosure, the processor 210 may be configured to compress the first replacement data table using a lossless compression scheme.

According to an embodiment of the present disclosure, the processor 210 may be configured to determine the size of the second block according to a range in which the first replacement data table applies. The second block may differ in size from the first block.

According to an embodiment of the present disclosure, the processor 210 may be configured to further include information for identifying the size of the second block in the compressed data.

According to an embodiment of the present disclosure, the electronic device 201 (or the electronic device 101) may include a communication circuit (e.g., the communication module 220) and a processor 210. The processor 210 may be configured to, upon receiving a request for transmitting target data, transmit first data of a first size, the first data including first encoding data obtained by encoding the target data and first additional data for decoding the first encoding data and upon receiving a request for re-transmitting the target data after the first data is transmitted, transmit second data of a second size, the second data including the first encoding data and second additional data for decoding the first encoding data. The second size may be smaller than the first size.

According to an embodiment of the present disclosure, the processor 210 may be configured to include a first replacement data table corresponding to first sub-data in the first additional data, the first sub-data included in the target, and the first replacement data table produced based on, at least, rankings of first frequencies for the first sub-data, and include information for reference to the first replacement data table in the second additional data.

Figure 3:
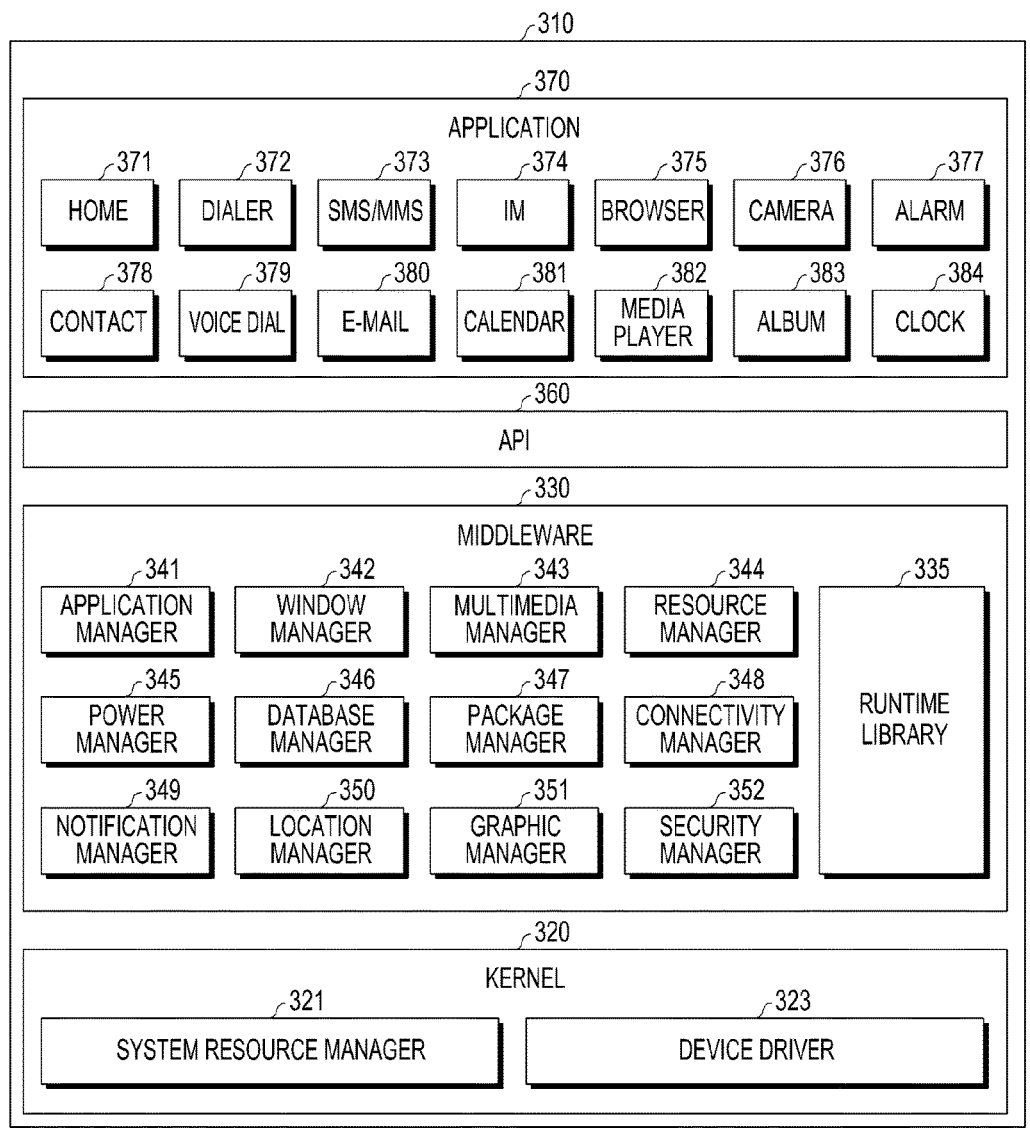
FIG. 3 is a block diagram illustrating a program module according to an embodiment of the present disclosure.

FIG. 3 is a block diagram illustrating a program module according to an embodiment of the present disclosure. According to an embodiment of the present disclosure, the program module 310 (e.g., the program 140) may include an operating system (OS) controlling resources related to the electronic device (e.g., the electronic device 101) and/or various applications (e.g., the application program 147) driven on the operating system. The operating system may include, e.g., Android™, iOS™, Windows™, Symbian™, Tizen™, or Bada™. Referring to FIG. 3, the program module 310 may include a kernel 320 (e.g., the kernel 141), middleware 330 (e.g., the middleware 143), an API 360 (e.g., the API 145), and/or an application 370 (e.g., the application program 147). At least a part of the program module 310 may be preloaded on the electronic device or may be downloaded from an external electronic device (e.g., the electronic devices 102 and 104 or server 106).

The kernel 320 may include, e.g., a system resource manager 321 or a device driver 323. The system resource manager 321 may perform control, allocation, or recovery of system resources. According to an embodiment of the present disclosure, the system resource manager 321 may include a process managing unit, a memory managing unit, or a file system managing unit. The device driver 323 may include, e.g., a display driver, a camera driver, a bluetooth driver, a shared memory driver, a USB driver, a keypad driver, a Wi-Fi driver, an audio driver, or an inter-process communication (IPC) driver. The middleware 330 may provide various functions to the application 370 through the API 360 so that the application 370 may use limited system resources in the electronic device or provide functions jointly used by applications 370. According to an embodiment of the present disclosure, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include a library module used by a compiler in order to add a new function through a programming language while, e.g., the application 370 is being executed. The runtime library 335 may perform input/output management, memory management, or arithmetic function processing. The application manager 341 may manage the life cycle of, e.g., the applications 370. The window manager 342 may manage GUI resources used on the screen. The multimedia manager 343 may grasp formats necessary to play media files and use a codec appropriate for a format to perform encoding or decoding on media files. The resource manager 344 may manage the source code or memory space of the application 370. The power manager 345 may manage, e.g., the battery capability or power and provide power information necessary for the operation of the electronic device. According to an embodiment of the present disclosure, the power manager 345 may interwork with a basic input/output system (BIOS). The database manager 346 may generate, search, or vary a database to be used in the applications 370. The package manager 347 may manage installation or update of an application that is distributed in the form of a package file.

The connectivity manager 348 may manage, e.g., wireless connectivity. The notification manager 349 may provide an event, e.g., arrival message, appointment, or proximity alert, to the user. The location manager 350 may manage, e.g., locational information on the electronic device. The graphic manager 351 may manage graphic effects to be offered to the user and their related user interface. The security manager 352 may provide system security or user authentication, for example. According to an embodiment of the present disclosure, the middleware 330 may include a telephony manager for managing the voice or video call function of the electronic device or a middleware module able to form a combination of the functions of the above-described elements. According to an embodiment of the present disclosure, the middleware 330 may provide a module specified according to the type of the operating system. The middleware 330 may dynamically omit some existing components or add new components. The API 360 may be a set of, e.g., API programming functions and may have different configurations depending on operating systems. For example, in the case of Android or iOS, one API set may be provided per platform, and in the case of Tizen, two or more API sets may be offered per platform.

The application 370 may include an application that may provide, e.g., a home 371, a dialer 372, an SMS/MMS 373, an instant message (IM) 374, a browser 375, a camera 376, an alarm 377, a contact 378, a voice dial 379, an email 380, a calendar 381, a media player 382, an album 383, or a clock 384, a heath-care (e.g., measuring the degree of workout or blood sugar), or provision of environmental information (e.g., provision of air pressure, moisture, or temperature information). According to an embodiment of the present disclosure, the application 370 may include an information exchanging application supporting information exchange between the electronic device and an external electronic device. Examples of the information exchange application may include, but is not limited to, a notification relay application for transferring specific information to the external electronic device, or a device management application for managing the external electronic device. For example, the notification relay application may transfer notification information generated by other application of the electronic device to the external electronic device or receive notification information from the external electronic device and provide the received notification information to the user. For example, the device management application may install, delete, or update a function (e.g., turn-on/turn-off the external electronic device (or some elements) or adjusting the brightness (or resolution) of the display) of the external electronic device communicating with the electronic device or an application operating on the external electronic device. According to an embodiment of the present disclosure, the application 370 may include an application (e.g., a healthcare application of a mobile medical device) designated according to an attribute of the external electronic device. According to an embodiment of the present disclosure, the application 370 may include an application received from the external electronic device. At least a portion of the program module 310 may be implemented (e.g., executed) in software, firmware, hardware (e.g., the processor 210), or a combination of at least two or more thereof and may include a module, program, routine, command set, or process for performing one or more functions.

As used herein, the term "module" includes a unit configured in hardware, software, or firmware and may interchangeably be used with other terms, e.g., "logic," "logic block," "part," or "circuit." The module may be a single integral part or a minimum unit or part of performing one or more functions. The module may be implemented mechanically or electronically and may include, e.g., an application-specific integrated circuit (ASIC) chip, field-programmable gate arrays (FPGAs), or programmable logic device, that has been known or to be developed in the future as performing some operations. According to an embodiment of the present disclosure, at least a part of the device (e.g., modules or their functions) or method (e.g., operations) may be implemented as instructions stored in a computer-readable storage medium (e.g., the memory 130), e.g., in the form of a program module. The instructions, when executed by a processor (e.g., the processor 120), may enable the processor to carry out a corresponding function. The computer-readable medium may include, e.g., a hard disk, a floppy disc, a magnetic medium (e.g., magnetic tape), an optical recording medium (e.g., compact disc-read only memory (CD-ROM), digital versatile disc (DVD), magnetic-optical medium (e.g., floptical disk), or an embedded memory. The instruction may include a code created by a compiler or a code executable by an interpreter. Modules or programming modules in accordance with various embodiments of the present disclosure may include at least one or more of the aforementioned components, omit some of them, or further include other additional components. Operations performed by modules, programming modules or other components in accordance with various embodiments of the present disclosure may be carried out sequentially, in parallel, repeatedly or heuristically, or at least some operations may be executed in a different order or omitted or other operations may be added.

Figure 4:
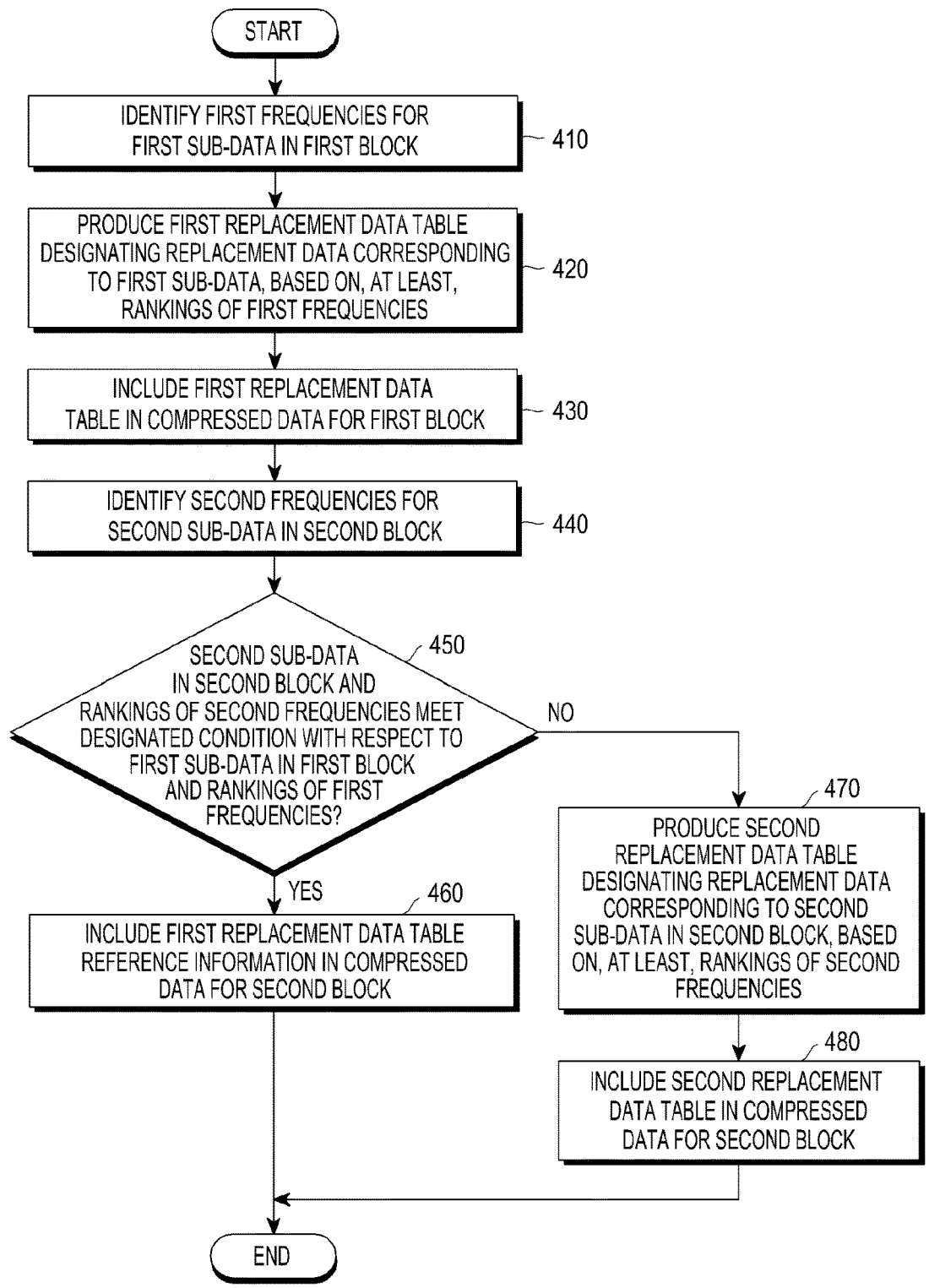
FIG. 4 is a flowchart illustrating a method for operating an electronic device according to an embodiment of the present disclosure.

FIG. 4 is a flowchart illustrating a method for operating an electronic device 101 according to an embodiment of the present disclosure. The electronic device 101 may include a memory 130 and a processor 120. The memory 130 may store data including multiple blocks (e.g., a first block and a second block). The processor 120 may produce compressed data by compressing the data stored in the memory. According to an embodiment of the present disclosure, the processor 120 may process the data in block units. For example, upon probability-based entropy coding, the processor 120 may identify probability information in block units, update codebooks or probability tables in block units, and compress data in block units. Although the probability information identification or the data compression is described with the same term "block" in connection with FIG. 4, the data processing units for identifying probability information and the data processing units for compressing data are not necessarily the same, but without limited thereto, may rather be implemented to differ from each other according to various embodiments. According to an implementation example, the term may also be replaced with "coding window" or may be defined or represented in other various manners.

In operation 410, the electronic device 101 (or the processor 120 or the processor 210) may identify first frequencies for first sub-data included in the first block. The first sub-data may be data split into minimum units or contextual units for identifying the data contained in the first block. For example, symbols contained in the first block may constitute the first sub-data. Symbol may mean identification data including a space, a number, an English character, a Korean character, or a figure. Hereinafter, the first sub-data or second sub-data may be referred to as a 'symbol.' According to an embodiment of the present disclosure, the electronic device 101 may identify the count of occurrence of each symbol in the corresponding block to calculate the frequency of the symbol, thereby identifying the first frequencies for the first sub-data contained in the first block. For example, the electronic device 101 may represent the symbols and their respective frequencies in a probability table, which is described below in detail in connection with FIG. 6A.

In operation 420, the electronic device 101 may produce a first replacement data table designating replacement data corresponding to the first sub-data based on, at least, the rankings of the first frequencies. The ranking of each frequency may mean the probability of occurrence of each sub-data in the corresponding block. For example, where it is identified that the ranking of frequency for symbol A in the first block is the highest, and the ranking of frequency for symbol B is the fourth highest, this may mean that, in the first block, the probability of occurrence of symbol A is higher than the probability of occurrence of symbol B. In the above example, further, where the first block is coded by variable-length entropy coding, replacement data designated for symbol A may be shorter in length than replacement data designated for symbol B. According to an embodiment of the present disclosure, the electronic device 101 may designate replacement data, e.g., binary code, corresponding to each corresponding symbol based on the probability for the symbol. The replacement data table may represent the relation between the symbols included in each corresponding block and replacement data designated for each symbol. The electronic device 101 may produce a first replacement data table by designating the replacement data based on the rankings of frequencies of all the symbols contained in the first block, i.e., the first sub-data.

In operation 430, the electronic device 101 may include the first replacement data table in the compressed data for the first block. Replacement data table may also be referred to as a codebook according to implementations. The compressed data may include information necessary for decoding, as well as the encoded data. For example, replacement data table information may be information used for decoding, and the replacement data table information may be contained in the compressed data.

In operation 440, the electronic device 101 may identify second frequencies for the second sub-data contained in the second block. The second sub-data contained in the second block may have the same type of symbols as the first sub-data contained in the first block. Like identifying the frequencies of the first sub-data contained in the first block, the electronic device 101 may identify the second frequencies by identifying the occurrence count of each symbol constituting the second sub-data. For example, the electronic device 101 may produce a probability table for the second block as shown in FIG. 6A.

In operation 450, the electronic device 101 may determine whether the second sub-data contained in the second block and the rankings of the second frequencies meet designated conditions with respect to the first sub-data contained in the first block and the rankings of the first frequencies. As shown in FIG. 6A described below, the electronic device 101 may produce the first probability table for the first block and the second probability table for the second block and compare the first probability table with the second probability table, thereby determining whether the are fully or partially the same in type of symbol or different in type of symbol and determining whether the rankings of frequencies as per probability are the same or different for the same symbols. For example, where the first block contains symbols {A, B, C, D}, and their respective frequency rankings are A, B, D, and C, respectively, while the second block contains symbols {A, B, C, D}, and their respective frequency rankings are A, B, D, C, respectively, the electronic device 101 may determine that the first block and the second block are the same symbols and the same symbol frequency rankings, thereby determining that the two blocks have the same occurring symbols and the same symbol probability rankings. Where the number of different symbols among all the occurring symbols is less than a threshold determined to be statistically ignorable, this may be represented as the occurring symbols being 'similar' and their frequency rankings being 'similar.' For example, where the symbols contained in a third block are {A, B, C, F} and their respective frequency rankings are A, B, F, and C, respectively, the first block and the third block may be determined to have similar occurring symbols and similar symbol probabilities. In such case, depending on the probability value of F, only index information about the first block, but rather than a replacement data table for the third block, may be sent, and F may be decoded as D—the overall result may be less influenced due to the low probability of F. However, this results in lossy compression. If the probability of F is high, replacement data for the third block may be created only with the index of the first block and D-F replacement information. As another information, where the symbols contained in a fourth block are {A, B, C, F} and their respective frequency rankings are F, C, A, and B, respectively, the first block and the fourth block may be determined to have similar occurring symbols but different symbol probabilities. Where the symbols contained in a fifth block are {A, *, X, Y} and their respective frequency rankings are *, X, Y, and A, respectively, the first block and the fifth block may be determined to have different occurring symbols and different symbol probabilities. In this case, a new replacement data table for the fifth block may be created for the fifth block without reusing the replacement data tables for the first to fourth blocks.

Where a sixth block has 27 symbol types, and a seventh block has 26 symbol types which are the same as those of the sixth block except for one symbol, the sixth block and the seventh block may be regarded as same. Where the frequency rankings of the symbols contained in the sixth block are the same as the frequency rankings of the symbols contained in the seventh block except for the symbol contained only in the sixth symbol, the frequency rankings for the sixth block may be regarded as being the same as the frequency rankings for the seventh block. Where it is identified from the respective probability tables of different blocks that the occurring symbols and their frequency rankings are, or are regarded as, the same, and are similar by a designated degree or more, encoding/decoding may be carried out using the same probability table for the different blocks, which may be more effective in light of compression efficiency than including different probability data for the different blocks.

Where it is determined in operation 450 that the second sub-data contained in the second block and the rankings of the frequencies corresponding to the second sub-data meet the designated conditions with respect to the first sub-data contained in the first block and the rankings of the frequencies corresponding to the first sub-data, the electronic device 101 may include information for reference to the first replacement data table in the compressed data for the second data in operation 460. According to an embodiment of the present disclosure, where the second sub-data contained in the second block is the same, or similar by a designated degree or more to the first sub-data contained in the first block while the rankings of the second frequencies for the second block are the same, or similar by a designated degree or more to the rankings of the first frequencies for the first block, the electronic device 101 may determine that the designated conditions are met. In the example of operation 440, the first block and the second block meet the designated conditions, and the first block and the third block may also be determined to meet the designated conditions. The first block and the fourth block may be determined to fail to meet the designated conditions, so may the fifth block and the fifth block.

Where the second sub-data contained in the second block and the first sub-data contained in the first block are the same, or similar by a designated degree or more, to each other, and the frequency rankings corresponding to the second sub-data contained in the second block are the same, or similar by a designated degree, to the frequency rankings corresponding to the first sub-data contained in the first block, the codebook for the first block may be reused for the second block, thus avoiding unnecessary data duplication due to the codebook on the compressed data for the second block. According to an embodiment of the present disclosure, the electronic device 101 may set the designated degrees depending on compressed data efficiency, e.g., 90% or more similar or 97% or more similar.

According to an embodiment of the present disclosure, as an example of reusing the codebook, the electronic device 101 may set, as the reference information, index information indicating the position of the first replacement data table pre-contained in the compressed data for the first block, and it will readily be appreciated by one of ordinary skill in the art that the index information is not limited to particular information but any other types of information able to identify the first replacement data table may be adopted as the reference information.

Where it is determined in operation 450 that the second sub-data contained in the second block and the rankings of the frequencies corresponding to the second sub-data fail to meet the designated conditions with respect to the first sub-data contained in the first block and the rankings of the frequencies corresponding to the first sub-data, the electronic device 101 may produce a second replacement data table designating replacement data corresponding to the second sub-data based on, at least, the rankings of the second frequencies for the second sub-data contained in the second block in operation 470. This is the case where the codebook used for the first block cannot be reused for the second block in which case a codebook intended for the second block may be produced and included in the compressed data. Although the description of operations 460 and 470 targets the first block and the second block, the codebook for the first block and the codebook for the second block may be reused for subsequent blocks to be processed.

In operation 480, the electronic device 101 may include the second replacement data table in the compressed data corresponding to the second block. In this case, the compressed data may include the first replacement data table corresponding to the first block, the second replacement data table corresponding to the second block, the first block-coded data, and the second block-coded data. On the other hand, the compressed data produced by operation 460 may include the first replacement data table corresponding to the first block, the information for reference to the first replacement data table, the first block-encoded data, and the second block-encoded data. Since the first replacement data table reference information may be smaller in size than the second replacement data table, the overall compressed data may reduce in size.

FIG. 5 is a concept view illustrating input data including multiple blocks according to an embodiment of the present disclosure. Referring to FIG. 5, input data may include block 1 510, block 2 520, block 3 530, block 4 540, block 5 550, block 6 560, and block N 570 which are the same size. The blocks may have the same size. According to an embodiment of the present disclosure, the electronic device 101 may identify the symbols in each block and their frequencies and may compare the symbols in the blocks and the frequency rankings of the symbols. Unlike in FIG. 5, the blocks constituting the input data may have different sizes which is described below in detail with reference to FIGS. 11 and 12C.

FIG. 6A is a view illustrating an example of a probability table for input data according to an embodiment of the present disclosure. For example, according to an embodiment of the present disclosure, the electronic device 101 may produce a probability table including symbol, count, and probability for one block in the input data of FIG. 5. The probability table may include symbol values, the respective counts of the symbols, and the probabilities of the symbols occurring in the block. According to an embodiment of the present disclosure, where one block has six symbol types that total 28 symbols, the electronic device 101 may produce a probability table as shown in FIG. 6A. It can be shown that the blank symbol, symbol A, and symbol @ occur in the block nine times, five times, and three times, respectively. The blank symbol, symbol A, and symbol @ may have probability values of 0.321429, 0.178571, and 0.107143, respectively. In the probability table of FIG. 6A, it can be shown that the occurring symbols are {blank, A, B, 1, *, @}, and their respective frequency rankings are *, A, 1, @ and B (or may be blank, *, A, @, 1, and B, and for symbols with the same frequency ranking, such as symbols 1 and @ ones positioned ahead in alphabetical order (order of symbol) may be regarded as having higher rankings).

According to an embodiment of the present disclosure, the electronic device 101 may compare a particular block with the other blocks in terms of symbol, frequency, and probability. For example, the electronic device 101 may make comparisons between the sub-data of each block and the sub-data of another and between the frequency rankings of the sub-data of each block and the frequency rankings of the sub-data of another by comparing the probability table of FIG. 6A with probability tables produced for the other blocks. Where the occurring symbols in the second block are {blank, A, B, 1, *}, and their respective frequency rankings are *, A, 1, and B, respectively, it may be regarded as same as the probability table of FIG. 6A. This may mean that reusing the probability table (or codebook) of FIG. 6A is effective in terms of compression efficiency. According to an embodiment of the present disclosure, the electronic device 101 may make the block-to-block comparisons based on the probability tables or replacement data tables designated as per the probability tables. The replacement data tables are described below in detail in connection with FIG. 7.

FIG. 6B is a view illustrating an example of a probability distribution per block for input data according to an embodiment of the present disclosure. According to an embodiment of the present disclosure, the electronic device 101 may represent input data including six blocks 610, 620, 630, 640, 650, and 660 in patterns indicating probability distributions as shown in FIG. 6B. For example, the six blocks 610 to 660 of FIG. 6B may be ones obtained by adding probability distributions to the blocks 510 to 560 of the input data shown in FIG. 5.

Referring to FIG. 6B, blocks 610 and 630 are represented in the same pattern, meaning that the two blocks meet designated conditions regarding occurring symbols and their respective frequency rankings. Blocks 610 and 630 may be regarded as having the same or similar probability distributions. The embodiment illustrated may exemplify the case where the occurring symbols in block 610 and the occurring symbols in block 630 are the same, or similar by a designated degree or more, and the frequency rankings for the symbols in block 610 and the frequency rankings for the symbols in block 630 are the same or similar by a designated degree or more, so that the two blocks meet the designated conditions. Accordingly, it is possible to compress the data in blocks 610 and 630 using the same probability table (or codebook) by a variable-length entropy coding scheme. According to an embodiment of the present disclosure, for the different blocks using the same probability table, the electronic device 101 may put information for reference to the probability table (or codebook), which has first been included in block 610, in block 630 without double-writing the probability data in the compressed data. In other words, according to an embodiment of the present disclosure, in order to reuse the probability table produced for block 610 in block 630, the electronic device 101 may add the information for reference to the probability table on the compressed data for block 610 to the compressed data for block 630. The overall compressed data may be shrunken by adding the probability table, which may be jointly used in blocks 610 and 630, only to the compressed data for block 610, given the size of the probability table itself.

Meanwhile, blocks 650 and 660 are shown in the same pattern and they may thus be interpreted as having the same or similar probability distributions. Accordingly, according to an embodiment of the present disclosure, the electronic device 101 may add the information for reference to the probability table on the compressed data for block 610 to the compressed data for block 660. Further, according to an embodiment of the present disclosure, the electronic device 101 may add, to the compressed data for block 660, replacement information regarding the symbols in block 650 that are different in type and frequency ranking from those in block 660. According to an embodiment of the present disclosure, the electronic device 101 may produce the same probability table by regarding the two blocks as having the same probability distribution. Referring back to FIG. 4, in the case where the sub-data for block 650 and its frequency rankings are the same, or similar by a designated degree or more, to the sub-data for block 660 and its frequency rankings in operation 450, information for reference to the replacement data table included in block 650 may be added to the compressed data for block 660, and replacement information regarding values partially needed to be replaced in the replacement data table may further be added to the compressed data for block 660 in operation 460. That is, the electronic device 101 may designate replacement values for some symbols with different probability values and replace some values in the same probability table, thereby allowing the same probability table to be reused in the different blocks.

According to an embodiment of the present disclosure, where the probability distributions meet designated conditions for the six different blocks of FIGS. 6A and 6B, the electronic device 101 may reuse the probability table in blocks 610 and 630, and the electronic device 101 may replace some values in the probability table for blocks 650 and 660 and reuse the probability table, thereby allowing the overall compressed data to be shrunken as compared with adding a probability table to each of the six blocks.

FIG. 7 is a view illustrating a replacement data table for input data according to an embodiment of the present disclosure. According to an embodiment of the present disclosure, the electronic device 101 may designate replacement data for encoding or decoding symbols included in blocks based on the frequency rankings of the symbols. By applying a probability-based variable-length entropy coding scheme, the electronic device 101 may designate shorter codes for relatively higher frequency ranking symbols and longer codes for relatively lower frequency ranking symbols. The electronic device 101 may reduce the amount of the overall encoded data by imparting variable-length codes to the symbols. According to an embodiment of the present disclosure, the electronic device 101 may produce a replacement data table, as shown in FIG. 7, per block. For example, the electronic device 101 may produce a first replacement data table for the first block and a second replacement data table for the second block. The electronic device 101 may compare the first replacement data table with the second replacement data table. Where the first replacement data table is the same as the second replacement data table, the electronic device 101 may include, in the compressed data, only the first replacement data table and information for reference to the first replacement data table. Where the first replacement data table is similar to the second replacement data table, the electronic device 101 may include, in the compressed data, the first replacement data table and information about differences between the first replacement data table and the second replacement data table. For example, where the first replacement data table and the second replacement data table are as shown in FIG. 7, the electronic device 101 may include the first replacement data table in the compressed data, corresponding to the first block, and include information for reference to the first replacement data table—e.g., an index value on the compressed data—corresponding to the second block. Where the first replacement data table is as shown in FIG. 7, and the second replacement data table is as shown in FIG. 7 except that the replacement data value (code value) for symbol A is 110 and the replacement data value for symbol B is 10, the first replacement data table may be reused with only the values of symbols A and B changed. Thus, according to an embodiment of the present disclosure, the electronic device 101 may include the first replacement data table in the compressed data corresponding to the first block and may include information for reference to the first replacement data table and replacement code values for symbols A and B in the compressed data corresponding to the second block. Otherwise, where the first replacement data table differs from the second replacement data table, the electronic device 101 may include the first replacement data table and the second replacement data table to the respective blocks in the compressed data.

FIG. 8 is a concept view illustrating compressed data according to an embodiment of the present disclosure. Compressed data may include data formatted as, e.g., a bit stream, to be appropriate for transmission and information for decoding. Referring to FIG. 8, the compressed data 800 may include a data area 820 into which data (e.g., original data or raw data) has been encoded and a header area 810 containing information necessary for decoding the data. The header area 810 may include block size and replacement data table information for use in encoding (or decoding). The same input data may come in different encoding area sizes depending on compression schemes. The size of the header area may be determined regardless of the efficiency of compression schemes. According to an embodiment of the present disclosure, the header area may include only index information for referring to replacement data table information previously included for blocks with the same or similar probability distributions. As compared with including a replacement data table in each block, a replacement data table may be reused for multiple blocks, with the information for reference to the replacement data table in the header area which has the replacement data table, and thus, the overall data may reduce in size.

According to an embodiment of the present disclosure, the electronic device 101 may compress, by a lossless compression scheme, the probability table in the header area or a replacement data table designated based on the probability information. Where the codebook of the current block is substantially similar to the codebook of its prior block, and at least one of the symbols has been replaced with a particular symbol with a low probability, the codebook of the prior block may be used by the user's choice so that the symbol value of the prior block is used for the particular symbol, thereby raising compression efficiency. This is the case where the entropy coding scheme itself causes lossy compression.

FIG. 9 is a view illustrating an example of compressed data including a plurality of blocks according to an embodiment of the present disclosure. Compressed data may include a block area 910, a block area 920, and a block area 930. The block area 910 may include a header area 911 and a data area 912.

Where the same probability distribution as has applied to the entropy coding scheme in the block area 910 applies to the block area 920, the header area 921 in the block area 920 does not include information about a replacement data table but includes information for reference to the replacement data table—i.e., index information—included in the header area 911 of the block area 910. Free of a replacement data table, the header area 921 of the block area 920 is relatively smaller in size than the header area 911 of the block area 910.

Where the probability distribution applied to the entropy coding scheme in the block area 910 is the same, or similar by a designated degree or more, to that in the block area 930, the replacement data table stored in the header area 911 of the block area 910 may be used with only some values changed. Or, the replacement data table may be used as it is, and this would not affect a lot the overall compression efficiency. If lossy compression is allowed, the replacement data table may be referenced via the index as described above. The header area 931 of the block area 930 may include information for reference to the replacement data table stored in the header area 911 of the block area 910 and symbol(s) to be replaced for use in the block area 930 and replacement data value(s) for the symbol(s). The header area 931 of the block area 930 is relatively smaller in size than the header area 911 of the block area 910.

As the reuse rate for the replacement data table on the compressed data increases, the header area decreases in size in light of the overall data volume with the result of increased compression efficiency. This minimizes unnecessary data duplication due to replacement data tables (or probability tables). Thus, as data transmissions reduce, more cost savings may be achieved.

Figure 10:
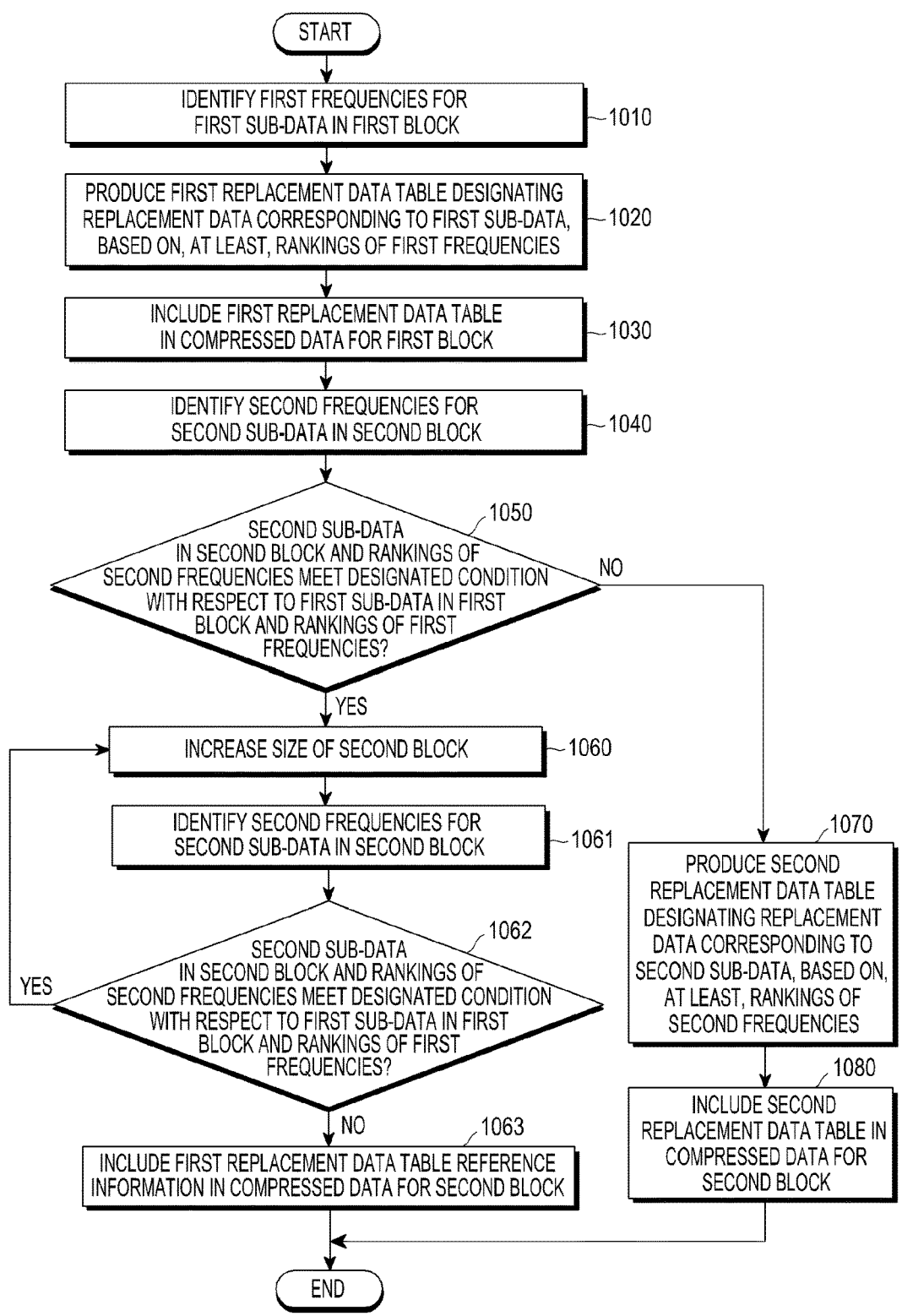
FIG. 10 is a flowchart illustrating a method for operating an electronic device according to an embodiment of the present disclosure.

FIG. 10 is a flowchart illustrating a method for operating an electronic device according to an embodiment of the present disclosure.

In operation 1010, the electronic device 101 (or the processor 120 or the processor 210) may identify first frequencies for first sub-data included in the first block.

In operation 1020, the electronic device 101 may produce a first replacement data table designating replacement data corresponding to the first sub-data based on, at least, the rankings of the first frequencies.

In operation 1030, the electronic device 101 may include the first replacement data table in the compressed data for the first block. For instance, the compressed data may include a data area that results from encoding the first block and a head area including a first replacement data table necessary for decoding the first block.

In operation 1040, the electronic device 101 may identify second frequencies for the second sub-data contained in the second block.

In operation 1050, the electronic device 101 may determine whether the second sub-data contained in the second block and the rankings of the second frequencies meet designated conditions with respect to the first sub-data contained in the first block and the rankings of the first frequencies. The designated conditions may be regarded as met when a threshold number of symbols have the same probability when the first block and the second block are compared with respect to the probability table including symbols and their respective corresponding probabilities. According to an embodiment of the present disclosure, difference criteria may be applied to the designated conditions to make a comparison and determination based on the probability information.

Where it is determined in operation 1050 that the second sub-data contained in the second block and the rankings of the second frequencies meet the designated conditions with respect to the first sub-data contained in the first block and the rankings of the first frequencies, the size of the second block may be increased in operation 1060. Varying the size of the second block may expand the range of reuse of the probability table (or replacement data table) for the blocks having the same or similar probability distributions. This may mean that the size of the blocks is determined depending on the range in which they have the same or similar probability distributions. Here, block size refers to a unit for using probability information upon applying probability-based entropy coding, and this may not always be the same as the unit for compressing data.

In operation 1061, the second frequencies for the second sub-data contained in the second block are identified. That is, the probability table may be updated by the sub-data and frequency for the enlarged portion. In operation 1062, it may be determined whether the probability table updated in the above operation meets the designated conditions with respect to the probability table of the first block.

Where it is determined in operation 1062 that the second sub-data contained in the second block and the rankings of the second frequencies meet the designated conditions with respect to the first sub-data contained in the first block and the rankings of the first frequencies, the size of the second block may be increased by operation 1060. The increase in size of the second block may be represented according to the range in which the probability distribution remains same.

Unless it is determined in operation 1062 that the second sub-data contained in the second block and the rankings of the second frequencies meet the designated conditions with respect to the first sub-data contained in the first block and the rankings of the first frequencies, the size of the second block is not increased, and the first replacement data table, which is already in the compressed data corresponding to the first block, may be reused for the second block within a range of meeting the designated conditions with respect to the first sub-data contained in the first block and the rankings of the first frequencies in operation 1050 for the second block. In operation 1063, the electronic device 101 may include information for reference to the first replacement data table in the compressed data for the second block. The first replacement data table reference information may be index information about the first replacement data table or a value indicating being the same as the probability table of the first block. Where the second block is processed continuous to the first block, the reference information may also be information indicating that the probability table previously used is to be used as it is.

Where it is determined in operation 1050 that the second sub-data contained in the second block and the rankings of the second frequencies fail to meet the designated conditions with respect to the first sub-data contained in the first block and the rankings of the first frequencies, the electronic device 101 may produce a second replacement data table designating replacement data corresponding to the second sub-data based on, at least, the rankings of the second frequencies in operation 1070. The first replacement data table differs from the second replacement data table, meaning that the first replacement data table is not reused for the second block. Further, the first replacement data table and the second replacement data table may be reused again later for other blocks. Upon reuse, only information for reference to the first replacement data table or second replacement data table may be included in the header area of the compressed data for the corresponding block in operation 1080.

FIG. 11 is a view illustrating an example of compressed data according to an embodiment of the present disclosure. Unlike FIG. 5 illustrating an embodiment in which blocks have fixed sizes, FIG. 11 illustrates an embodiment in which blocks may be differentiated depending on the degree of the probability distributions being the same or similar by a designated degree or more and may thus be configured as size-variable. The compressed data 1100 may include four blocks 1110, 1120, 1130, and 1140 with different sizes. The blocks marked with the same denotations may mean that they have the same or similar probability distributions whereas the blocks marked with different denotations may mean that they have different probability distributions. Further, probability distributions being the same or similar by a designated degree or more may mean that the probability table is reusable. For example, blocks 1110 and 1130 may have the same symbols and the same frequency rankings corresponding to the symbols. In this case, the same probability information may be utilized upon encoding/decoding by a probability-based entropy coding technique. Thus, the probability information (e.g., probability table or replacement data table) may be avoided from being written in duplicate in the header area. The index information about the probability information which is already in block 1110 may be added to block 1130 so that encoding/decoding may be performed based on the same probability information.

As another example, blocks 1110 and 1120 may have different symbols and different frequency rankings corresponding to the symbols. In this case, upon encoding/decoding by a probability-based entropy coding scheme, probability tables or replacement data tables each of which is based on a respective one of the different pieces of probability information may be put to use.

Blocks 1110 to 1140 have different sizes and each correspond to different data. However, since blocks 1110 and 1130 have the same probability distribution, and so do blocks 1120 and 1140, the probability information may be reused in encoding/decoding as per probability-based entropy coding.

FIG. 12A illustrates an example of input data according to an embodiment of the present disclosure. According to various embodiments, the probability tables for input data may be identified in units of blocks with fixed sizes or variable sizes.

In order to compress raw data to the minimum size, the probability tables according to various embodiments, and the embodiment that achieves the most reuse rate for a probability table may be chosen and determined as a data compression method. Conversely, in the case where real-time processing is used, data compression may be carried out by identifying probability tables in block units each having a predesignated size and minimizing the duplication of the portions containing probability information in the compressed data according to the reuse rate.

FIG. 12B is a concept view illustrating a fixed block probability table for input data according to an embodiment of the present disclosure. According to an embodiment of the present disclosure, the electronic device 101 may process the input data of FIG. 12A into blocks with a fixed size, e.g., 8 bits, and may identify the sub-data in the blocks and its frequency rankings. For example, the electronic device 101 may identify the count of symbols (sub-data) included in the area 1210. Specifically, a probability table for the area 1210 may be produced as set forth in Table 1 below.

TABLE 1

| Symbol | Occurrence count | Probability value |
|---|---|---|
| A | 4 | 1/2 |
| B | 2 | 1/4 |
| C | 2 | 1/4 |

The electronic device 101 may produce a probability table as shown in Table 2 below by identifying the count of the symbols in the area 1220.

TABLE 2

| Symbol | Occurrence count | Probability value |
|---|---|---|
| A | 2 | 1/4 |
| B | 4 | 1/2 |
| C | 2 | 1/4 |

Although the areas 1210 and 1220 include the same types of symbols, it can be identified that the rankings of frequencies corresponding to the symbols differ. Symbol A occurs four times with a probability value of ½ in Table 1 but two times with a probability value of ¼ in Table 2. Upon encoding the areas 1210 and 1220 by probability-based variable-length entropy coding, relatively-shorter replacement data may be designated for the As in the area 1210, which have a larger probability value, and relatively-longer replacement data may be designated for the As in the area 1220, which have a smaller probability value.

Table 3 represents symbols in the area 1230 and their respective corresponding counts and probability values.

TABLE 3

| Symbol | Occurrence count | Probability value |
|---|---|---|
| A | 2 | 1/4 |
| B | 4 | 1/2 |
| C | 2 | 1/4 |

Table 3 and Table 2 have the same symbols and symbol probability distributions. The probability table used for the area 1220 may be reused as a probability table for the area 1230. Accordingly, the electronic device 101 may include only information (e.g., index information) for reference to the probability table or replacement data table which is already in the area 1210, but rather than a replacement data table, which designates replacement data for each symbol based on a probability table or probability information, in the compressed data for the area 1230.

According to an embodiment of the present disclosure, the electronic device 101 may produce probability distributions for the areas 1240 to 1260 in the same manner as it produces Tables 1 to 3 for the areas 1210 to 1230, and the electronic device 101 may determine whether to use any one or more of the probability tables. In turn, the electronic device 101 may reuse the probability tables for the areas 1220 and 1230 and the probability tables for the areas 1240 and 1260.

FIG. 12C is a concept view illustrating a probability table for variable blocks in input data according to an embodiment of the present disclosure. To maximize the reuse rate of a probability table, it may be determined whether to reuse the probability table in units of variable-size blocks. Accordingly, according to an embodiment of the present disclosure, the electronic device 101 may determine whether the fixed-size blocks have the same or similar probability distributions as shown in FIG. 12B, and the electronic device 101 may also determine the size of blocks to share a probability table corresponding to the range in which they have the same or similar probability distributions as shown in FIG. 12C.

FIG. 12C illustrates blocks 1201, 1203, 1205, and 1207 differentiated corresponding to the range in which the input data of FIG. 12A has the same probability distribution, and probability tables for the blocks 1201, 1203, 1205, and 1207 may be represented as shown in Table 4 below.

TABLE 4

|  | 1201 | 1203 | 1205 | 1207 |
|---|---|---|---|---|
| Symbol | A, B, C | A, B, C | A, B, C | A, B, C |
| Occurrence count | count(A) = 2, count(B) = 2, count(C) = 2 | count(A) = 4, count(B) = 3, count(C) = 1 | count(A) = 2, count(B) = 2, count(C) = 2 | count(A) = 12, count(B) = 9, count(C) = 3 |
| Probability value | p(A) = 1/3, p(B) = 1/3, p(C) = 1/3 | p(A) = 1/2, p(B) = 3/8, p(C) = 1/8 | p(A) = 1/3, p(B) = 1/3, p(C) = 1/3 | p(A) = 1/2, p(B) = 3/8, p(C) = 1/8 |

Blocks 1201 and 1205 may use the same probability table p1. Blocks 1203 and 1207 may use the same probability table p2. According to an embodiment of the present disclosure, blocks with completely the same probability values, such as blocks 1201 and 1205, may use the same probability table. Further, the blocks may use the same probability table even despite a slight difference in probability value as long as they have the same order of symbol occurrence counts. For example, where count(C)=4 and probability value=4/25 in block 1207, block 1207 may use the same probability table (or codebook) as block 1203. This is why block 1207 remains the same as block 1203 in terms of symbol probability ranking or frequency ranking.

Whether to reuse a probability table may be determined on the same input data of FIG. 12A by producing probability distributions corresponding to fixed-size blocks as shown in FIG. 12B or by differentiating among variable block areas corresponding to the range in which the probability distributions remain the same as shown in FIG. 12C.

According to an embodiment of the present disclosure, there may be provided a computer-readable recording medium storing instructions configured to perform at least one operation by a processor, the at least one operation comprising producing, by the processor, compressed data by compressing data stored in a memory functionally connected with an electronic device, including, by the processor, a first replacement data table corresponding to first sub-data in the compressed data, the first sub-data included in a first block of the data, and the first replacement data table produced based on, at least, rankings of first frequencies for the first sub-data, and including, by the processor, information for reference to the first replacement data table, corresponding to the second block, when second sub-data included in a second block of the data and rankings of second frequencies for the second sub-data meet a designated condition with respect to the first sub-data included in the first block and the rankings of the first frequencies.

According to an embodiment of the present disclosure, the processor may be configured to determine that the designated condition is met when the second sub-data included in the second block and the rankings of the second frequencies are the same, or similar by a designated degree or more, to the first sub-data included in the first block and the rankings of the first frequencies.

According to an embodiment of the present disclosure, including the first replacement data table reference information corresponding to the second block may include designating, as the first replacement data table reference information, index information about a position of the first replacement data table in the compressed data.

According to an embodiment of the present disclosure, the at least one operation may further comprise further including, by the processor, at least one piece of replacement information for the first replacement data table, corresponding to the second block. The replacement information may be replacement information about a replacement data value designated corresponding to sub-data of the second sub-data contained in the second block, which differs in type and frequency ranking from the first sub-data contained in the first block.

According to an embodiment of the present disclosure, the length of replacement data designated for the first sub-data may be determined in proportion to the rankings of the first frequencies for the first sub-data.

As is apparent from the foregoing description, according to various embodiments of the present disclosure, the electronic device may reuse the same or similar probability table(s) or codebook(s), shrinking the compressed data. According to various embodiments of the present disclosure, where different blocks have the same probability distributions, the electronic device may include information for reference to a probability table which is already in the compressed data for one block in the compressed data for the other blocks. According to various embodiments of the present disclosure, where different blocks have probability distributions similar enough to allow the probability table or codebook which is already in the compressed data to be used for the other blocks with some values in the probability table, or codebook, changed, the electronic device may include information for reference to the probability table or codebook and information about the changes, in the compressed data for the other blocks.

The embodiments disclosed herein are proposed for description and understanding of the disclosed technology and does not limit the scope of the present disclosure. Accordingly, the scope of the present disclosure should be interpreted as including all changes or various embodiments based on the technical spirit of the present disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device, comprising:
a memory; and
a processor configured to:
produce compressed data by compressing data including a first block and a second block stored in the memory,
include a first replacement data table corresponding to first sub-data in the compressed data, wherein the first sub-data is included in the first block and the first replacement data table is produced based on, at least, rankings of first frequencies for the first sub-data, and
include information for reference to the first replacement data table corresponding to the second block, when second sub-data included in the second block and rankings of second frequencies for the second sub-data meet a designated condition with respect to the first sub-data included in the first block and the rankings of the first frequencies.

2. The electronic device of claim 1, wherein the processor is configured to determine that the designated condition is met when the second sub-data included in the second block and the rankings of the second frequencies for the second sub-data are the same, or similar by a designated degree or more, as the first sub-data included in the first block and the rankings of the first frequencies.

3. The electronic device of claim 1, wherein the processor is configured to designate, as first replacement data table reference information, index information indicating a position of the first replacement data table in the compressed data.

4. The electronic device of claim 1, wherein the processor is configured to further include at least one piece of replacement information for the first replacement data table corresponding to the second block.

5. The electronic device of claim 4, wherein:
the replacement information is about a replacement data value designated corresponding to sub-data of the second sub-data contained in the second block, and
the second sub-data differs in type and frequency ranking from the first sub-data contained in the first block.

6. The electronic device of claim 1, wherein the processor is configured to determine a length of replacement data designated for the first sub-data in proportion to the rankings of the first frequencies for the first sub-data.

7. The electronic device of claim 1, wherein the processor is configured to compress the data in a variable-length entropy coding scheme.

8. The electronic device of claim 7, wherein the processor is configured to use the rankings of the first and second frequencies for the first and second sub-data included in each block of the data as probability information for the variable-length entropy coding scheme.

9. The electronic device of claim 1, wherein the processor is configured to compress the first replacement data table using a lossless compression scheme.

10. The electronic device of claim 1, wherein the processor is configured to determine a size of the second block according to a range in which the first replacement data table applies.

11. The electronic device of claim 10, wherein the second block is different in size from the first block.

12. The electronic device of claim 11, wherein the processor is configured to include information for identifying the size of the second block in the compressed data.

13. An electronic device, comprising:
a communication circuit; and
a processor configured to:
- upon receiving a request for transmitting target data, transmit first data of a first size, the first data including first encoding data obtained by encoding the target data and first additional data for decoding the first encoding data, and
- upon receiving a request for re-transmitting the target data after the first data is transmitted, transmit second data of a second size, the second data including the first encoding data and second additional data for decoding the first encoding data, wherein the second size is smaller than the first size.

14. The electronic device of claim 13, wherein the processor is configured to:
- include a first replacement data table corresponding to first sub-data in the first additional data, wherein the first sub-data is included in the target data and the first replacement data table is produced based on, at least, rankings of first frequencies for the first sub-data, and
- include information for reference to the first replacement data table in the second additional data.

15. A non-transitory computer-readable recording medium storing instructions that, when executed by a processor, cause the processor to perform an operation comprising:
- producing compressed data by compressing data stored in a memory functionally connected with an electronic device;
- including a first replacement data table corresponding to first sub-data in the compressed data, wherein the first sub-data is included in a first block of the data and the first replacement data table is produced based on, at least, rankings of first frequencies for the first sub-data; and
- including information for reference to the first replacement data table corresponding to a second block, when second sub-data included in a second block of the data and rankings of second frequencies for the second sub-data meet a designated condition with respect to the first sub-data included in the first block and the rankings of the first frequencies.

16. The non-transitory computer-readable recording medium of claim 15, wherein the processor is configured to determine that the designated condition is met when the second sub-data included in the second block and the rankings of the second frequencies are the same, or similar by a designated degree or more, to the first sub-data included in the first block and the rankings of the first frequencies.

17. The non-transitory computer-readable recording medium of claim 15, wherein including first replacement data table reference information corresponding to the second block includes designating, as the first replacement data table reference information, index information about a position of the first replacement data table in the compressed data.

18. The non-transitory computer-readable recording medium of claim 15, wherein the operation further comprises including at least one piece of replacement information for the first replacement data table, corresponding to the second block.

19. The non-transitory computer-readable recording medium of claim 18, wherein:
- the replacement information is about a replacement data value designated corresponding to sub-data of the second sub-data contained in the second block, and
- the second sub-data differs in type and frequency ranking from the first sub-data contained in the first block.

20. The non-transitory computer-readable recording medium of claim 15, wherein a length of replacement data designated for the first sub-data is determined in proportion to the rankings of the first frequencies for the first sub-data.

* * * * *